United States Patent [19]
Flach et al.

[11] 4,050,021
[45] Sept. 20, 1977

[54] MOVING-COIL MEASURING SYSTEM WITH A LARGE POINTER DEFLECTION

[75] Inventors: Hans-Georg Flach, Kronberg; Bernhard Stier, Schwalbach, both of Germany

[73] Assignee: VDO Adolf Schindling AG, Frankfurt am Main, Germany

[21] Appl. No.: 702,457

[22] Filed: July 6, 1976

[30] Foreign Application Priority Data

July 24, 1975 Germany ............................. 2533057

[51] Int. Cl.² .......................... G01R 5/08; G01R 1/02
[52] U.S. Cl. .................................................. 324/150
[58] Field of Search ............... 324/150, 151 R, 151 A, 324/154

[56] References Cited
U.S. PATENT DOCUMENTS

| | | | |
|---|---|---|---|
| 2,004,724 | 6/1935 | Herzog | 324/150 X |
| 2,816,255 | 12/1957 | Greif | 324/151 A |
| 3,056,923 | 10/1962 | Parker | 324/150 |
| 3,237,103 | 2/1966 | Kunz et al. | 324/150 |
| 3,378,768 | 4/1968 | Hautmann | 324/150 |
| 3,395,349 | 7/1968 | Bajars | 324/150 |
| 3,490,043 | 1/1970 | Faria | 324/150 |
| 3,569,832 | 3/1971 | Marusek | 324/150 |

*Primary Examiner* — Gerard R. Strecker
*Attorney, Agent, or Firm* — Otto John Munz

[57] ABSTRACT

A moving-coil measuring system with a large pointer deflection, utilizing a pole ring having a projection, a pole plate with a projection, a permanent magnet arranged between the projections, and a moving coil embracing the pole ring. The shaft of the coil rotates in two bushings which are concentric with respect to the pole ring. One of the bushings is mounted in the pole plate and the other bushing is mounted in a support fastened to the pole plate.

8 Claims, 4 Drawing Figures

MOVING-COIL MEASURING SYSTEM WITH A LARGE POINTER DEFLECTION

BACKGROUND OF THE INVENTION

1. Field of the Invention

The invention relates to moving coil measuring instruments.

2. Description of the Prior Art

Moving-coil measuring systems with a large pointer deflection are already known wherein the pole plate is shaped like a cup in which the pole ring is inserted. Between the pole ring and the cup bottom, a permanent magnet is inserted. A moving coil embracing the pole ring is fastened to a shaft which rotates in two bushings. One of the bushings is mounted centrally in the cup bottom and the other is mounted on a support fastened to the cup. Such a moving-coil measuring system has the disadvantage that it is not suited for large-scale production because variations of the magnetic flux occurring in such production and acting upon the moving coil cannot subsequently be compensated, for example, on the basis of a small eccentricity of the individual parts.

Furthermore, moving-coil measuring systems are known which comprise a pole plate with a projection, a pole ring parallel thereto provided with a projection, and a permanent magnet mounted between the projections of pole plate and pole ring, as well as a bearing block with two bushings for the shaft of the moving coil embracing the pole ring. Bearing block, pole plate, pole ring, and permanent magnet are combined into a structural unit by means of two screws. In these moving-coil measuring systems, a screening plate is provided on the pole plate surface adjacent to the pole ring with an edge area projecting against the pole ring and consisting of a multiplicity of fins, for the purpose of correcting the variations of the magnetic flux acting upon the moving coil which result from variations in manufacture. By bending the individual fins more or less upward, it is possible to eliminate the variations of the indication characteristic which result, for example, from a slightly eccentric position of the moving-coil shaft with respect to the pole ring. Such a correction, however, of the characteristic is quite time-consuming, and consequently such moving-coil measuring systems are still relatively expensive, notwithstanding the fact that otherwise their structure is favorable with regard to manufacture and assembly.

SUMMARY OF THE INVENTION

These disadvantages of the known moving-coil measuring systems are overcome by the invention. The invention provides a moving coil measuring system with large pointer deflection which can be manufactured at the smallest expenditure of time and money. The measuring system is constructed in such a way that, after its complete assembly, no correction at all of the indication characteristic or at most an inexpensive correction is necessary.

This is accomplished with the moving coil measuring system initially described, according to the invention, by centrally fastening, with respect to each other, the bushing adjacent to the pole ring, and the pole ring on the pole plate.

It is thus possible to achieve, at least in the area of the pole ring, a centering of the moving coil with respect to the pole ring so accurate that a correction of the indication characteristic after the assembly of the measuring system is no longer absolutely necessary. According to a further concept of the invention, in order to fasten the other bushing centrally to the pole ring, the support that bears the bushing can be shaped as a hoop whose base portion bears two pins engaging corresponding holes of the pole plate. This makes it possible to dispense completely with a characteristic correction, except for a few cases which depend on the use of the moving-coil measuring system. However, even if a correction were carried out for achievement of still better linearity, the correction can be carried out much faster than in prior art systems because of the structure of a device according to the invention, as explained below. In a preferred embodiment, a concentric bearing ear is molded to the pole ring and the bushing which is mounted in the plate is converted, at the end adjacent to the pole ring, into a pivot pin for the bearing ear. Such an embodiment has the advantage that fully satisfactory centering of the pole ring with respect to the bushing adjacent thereto can be achieved in a simple way. Due to such centering, the variations of the magnetic flux acting upon the moving coil can occur only to a very small extent, even at a small eccentricity of the bushing facing away from the pole ring. Moreover, if in the embodiment described above, the support bearing the other bushing, which support is normally shaped as a one-arm bearing block screwed to the pole plate, is shaped as a hoop whose base bears two pins engaging corresponding holes of the pole plate, the extent of the variations is further diminished.

As already mentioned, it may under certain circumstances be desirable to correct the linearity of the indication characteristic further. This can be done by means of an adjustable screening element mounted on the pole-plate surface adjacent to the pole ring and provided with an edge area protruding toward the pole ring. In such a moving-coil measuring system, according to a further concept of the invention, the screening element is shaped as a cup with a recess at the area associated with the permanent magnet. This cup is pivotable about an eccentric axis adjacent to the limiting deflection of the moving coil. Because of the good eccentricity of the pole ring and bushings in the moving-coil measuring system of the invention, the pivoting of the cup-shaped screen element by a few degrees suffices fully for achieving the desired characteristic linearity.

In an embodiment which is preferred for reasons relating to manufacture and assembly, for the purpose of pivotably supporting the screening cup, it is provided with a hole engaged by a pinlike projection in the pole plate. Furthermore, the provision of a slot positioned above a hole in the pole plate at a point approximately facing the pivot shaft of the screening cup has proved practical. This entails the advantage of an adjustment which can be carried out rapidly and merely by means of a screw driver. In order to prevent the occurrence of an undesirably strong flux change in the area of the limiting deflection of the moving coil when the cup-shaped screening element pivots, it is advisable to bevel the end which is adjacent to the rotary shaft of the edge of the screening element.

BRIEF DESCRIPTION OF THE DRAWINGS

The invention will be explained in greater detail with the aid of the drawings which illustrate an embodiment in partly diagrammatical representation.

DESCRIPTION OF THE PREFERRED EMBODIMENT

Figure 1:
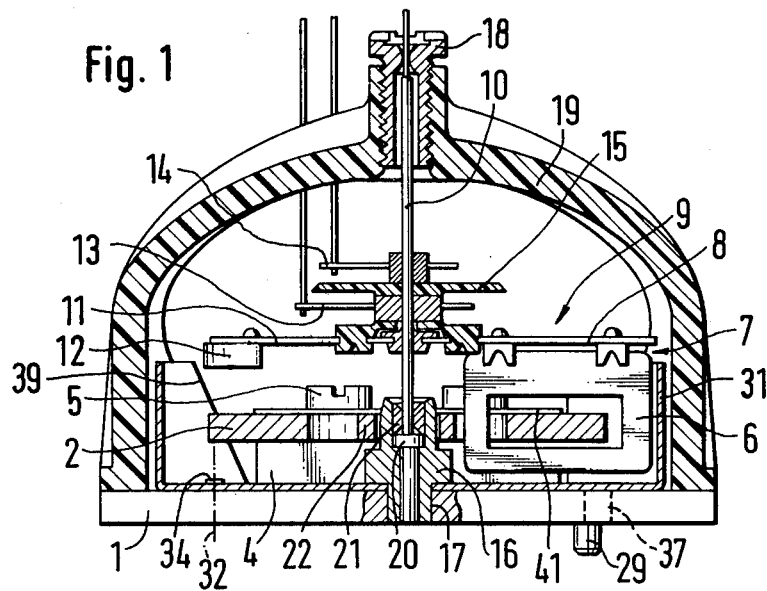
FIG. 1 illustrates a longitudinal section through a moving-coil measuring system with a moving coil turned by an angle of 30° from its position of rest.
Figure 2:
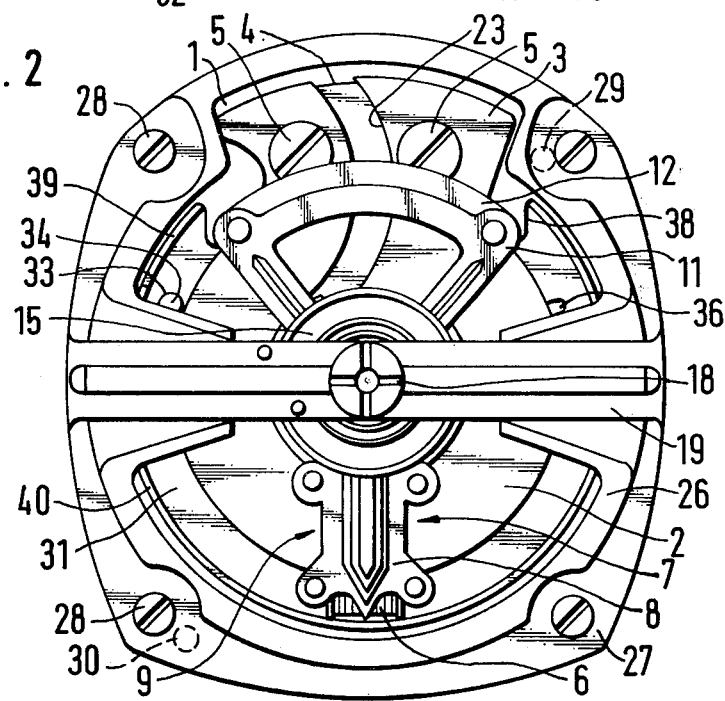
FIG. 2 is a plan view of the moving-coil measuring system as in FIG. 1, with the moving coil turned by an angle of 120° from its position of rest.

As shown in FIGS. 1 and 2, the moving-coil measuring system consists of a pole plate 1, a pole ring 2 with a projection 3, and a permanent magnet 4 which is mounted between projection 3 and pole plate 1. Pole ring 2 and permanent magnet 4 are fastened, by means of two screws 5 to pole plate 1. Pole plate 1 and pole ring 2 are constructed of a ferromagnetic material.

Pole ring 2 penetrates the coil form 6 of a moving coil 7. Coil form 6 is fastened to an arm 8 of a support 9 which is mounted on a shaft 10. A counterbalance weight 12 is mounted on the other arm 11 of support 9. Above support 9, two spiral springs 13 and 14 are mounted which serve as current supply leads to the coil. Between the two spiral springs 13 and 14 is provided an insulating disc 15.

Shaft 10 is mounted, on one side, in a bushing 16 which is pressed into a corresponding hole 17 in pole plate 1, and, on the other side, in a bushing 18 which is screwed into a support 19 constructed of plastics material. Shaft 10 is supported in bushing 16 by a plate 20, which is held by a centering sleeve 21 pressed into bushing 16. In the area of bushing 18, shaft 10 is offset and supported with the thinner shaft portion in bushing 18. Because of this device, the axial play of shaft 10 can be exactly adjusted by rotation of bushing 18.

Figure 3:
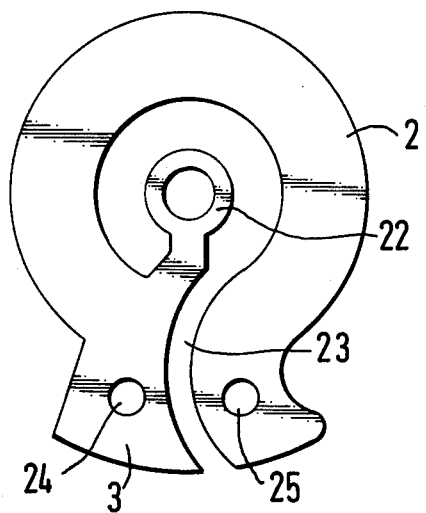
FIG. 3 is a plan view of the pole ring of the moving-coil measuring system of FIG. 1.

Bushing 16 pressed into pole plate 1 is shaped on its periphery as a centering pin for pole ring 2. To the pole ring, as shown particularly in FIG. 3, a concentric support ear 22 is molded which is engaged by the centering pin. Pole ring 2 is also provided with a recess 23 which permits coil form 6 to be slid upon pole ring 2. The two holes 24 and 25 positioned in projection 3 allow for fastening by means of screws 5.

Support 19 is shaped as a hoop whose base portions are in each case converted into a ring 26. To the ring in turn, an attachment flange 27 is molded. Attachment flange 27 is fastened, by means of four screws 28, to pole plate 1. The fixation in position of flange 27 on pole plate 1, and thus the coaxial alignment of bushing 18 with respect to bushing 16, takes place by means of two pins 29 and 30 molded to attachment flange 27 which fit in corresponding holes in pole plate 1.

Figure 4:
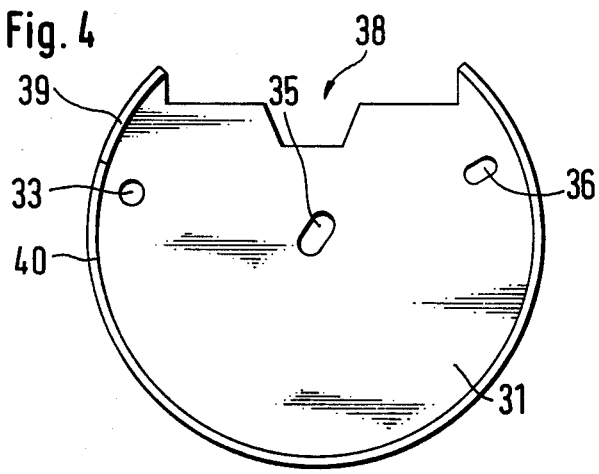
FIG. 4 is a plan view of the screening element of the moving-coil measuring system of FIG. 1.

For correction of the indication characteristic of the measuring system, a cup-shaped screening element 31 is provided which is pivotable about a shaft 32. For the purpose of supporting screening cup 31 pivotably, the cup, as shown especially in FIG. 4, is provided with a hole 33 concentric with respect to shaft 32, through which a pin-like projection 34 in pole plate 1 protrudes. Screening cup 31 is provided with a further hole 35 through which, in the assembled state, bushing 16 protrudes, and is also provided with a slot-like hole 36 corresponding to a hole 37 in pole plate 1. By the introduction of a screwdriver in slotlike hole 36, the screen cup 31 can be pivoted about shaft 32. Furthermore, the screen cup 31 is provided with a recess 38 for the permanent magnet 4 and with a beveling 39 of the edge 40 adjacent to rotary shaft 32.

The end stop metal sheet marked 41 for moving coil 7, which is clamped by screws 5, is not shown in FIG. 2 for the sake of clarity.

We claim:

1. In a moving-coil measuring system with large pointer deflection, comprising:
   A. a pole plate,
   B. a pole ring including a projection,
   C. a permanent magnet arranged between the pole plate and the projection,
   D. a first bushing mounted in the pole plate,
   E. a second bushing in a support fastened to the pole plate, the first and second bushings being concentric with respect to the pole ring, and
   F. a moving coil embracing the pole ring and mounted on a shaft, said shaft rotating in the first and second bushings, the moving coil being adapted to move a pointer,
   the improvement comprising:
   G. means for fastening the first bushing to the pole ring at a point on the pole ring which is fixed adjacent to the first bushing and which integrally forms a central part of the pole ring.

2. A moving-coil measuring system according to claim 1, further comprising:
   A. a concentric support ear molded to the pole ring, and
   B. a pivot pin for the support ear formed on the first bushing on the end thereof adjacent to the pole ring.

3. A moving-coil measuring system according to claim 2, further comprising:
   A. hoop-shaped support means for fixing the second bushing centrally with respect to the pole ring, and
   B. a base portion of the support means including two pins for engaging corresponding holes in the pole plate.

4. A moving-coil measuring system according to claim 3, further comprising:
   A. an adjustable cup-shaped screening element for correcting the indication characteristic of the measuring system, the screening element being mounted on the surface of the pole plate adjacent to the pole ring with an edge area extending toward the pole ring, the cup having a recess in the area occupied by the permanent magnet, and
   B. means for pivoting the cup about an eccentric shaft adjacent to the limiting deflection of the moving coil.

5. A moving-coil measuring system according to claim 4, further comprising:
   A. means for engaging a hole in the screening cup by a pin-like projection in the pole plate, whereby the screening cup is pivotably supported.

6. A moving-coil measuring system according to claim 5, wherein the end adjacent to the eccentric shaft of the edge area is beveled.

7. A moving-coil measuring system according to claim 6, further comprising a slot in the screening cup approximately opposite the eccentric shaft, the slot being positioned above a hole in the pole plate.

8. A system according to claim 1, wherein the pole ring comprises leg integral therewith extending to the center of the pole ring, the fastening means comprising means to fasten the leg at the center of the pole ring to the first bushing.

* * * * *